(12) United States Patent
Shigematsu

(10) Patent No.: US 11,290,078 B2
(45) Date of Patent: Mar. 29, 2022

(54) FILTER ELEMENT

(71) Applicant: Murata Manufacturing Co., Ltd., Nagaokakyo (JP)

(72) Inventor: Satoshi Shigematsu, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/087,657

(22) Filed: Nov. 3, 2020

(65) Prior Publication Data

US 2021/0050837 A1     Feb. 18, 2021

Related U.S. Application Data

(63) Continuation of application No. PCT/JP2019/020695, filed on May 24, 2019.

(30) Foreign Application Priority Data

Jun. 8, 2018   (JP) .............................. JP2018-110155

(51) Int. Cl.
  *H03H 7/01*    (2006.01)
  *H03H 7/09*    (2006.01)
  *H01F 27/28*   (2006.01)
  *H01F 27/29*   (2006.01)
  *H03H 1/00*    (2006.01)

(52) U.S. Cl.
  CPC ....... *H03H 7/0115* (2013.01); *H01F 27/2804* (2013.01); *H01F 27/29* (2013.01); *H03H 1/00* (2013.01); *H01F 2027/2809* (2013.01); *H03H 2001/0085* (2013.01)

(58) Field of Classification Search
  CPC ................... H03H 7/09; H03H 7/0115; H03H 2001/0085
  USPC .................................................. 333/175, 185
  See application file for complete search history.

(56) References Cited

U.S. PATENT DOCUMENTS

| 2015/0310994 | A1  | 10/2015 | Yosui et al. |
| 2018/0041182 | A1  | 2/2018  | Nishida et al. |
| 2018/0102752 | A1* | 4/2018  | Kishimoto .............. H01P 1/205 |

FOREIGN PATENT DOCUMENTS

| WO | 2014/115434 A1 | 7/2014 |
| WO | 2014/141559 A1 | 9/2014 |
| WO | 2016/167171 A1 | 10/2016 |

OTHER PUBLICATIONS

Official Communication issued in International Patent Application No. PCT/JP2019/020695, dated Jul. 2, 2019.

* cited by examiner

*Primary Examiner* — Rakesh B Patel
(74) *Attorney, Agent, or Firm* — Keating & Bennett, LLP

(57) ABSTRACT

A filter element includes series inductors connected in series to a signal path, shunt inductors shunt-connected between the signal path and ground, and a capacitor connected in series to the shunt inductors. The shunt inductors include first and second shunt inductors connected in parallel to each other. Conductive patterns of the capacitor are overlapped with coil opening portions of the series inductors and the shunt inductors viewed from a lamination direction. The capacitor is sandwiched between the first shunt inductor and the second shunt inductor in the lamination direction of insulating layers and the conductive patterns.

22 Claims, 14 Drawing Sheets

FIG. 7
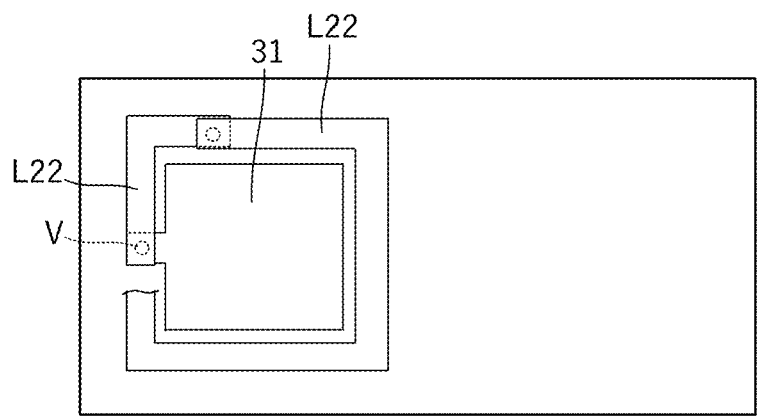
FIG. 8
| | L1[μH] | L2[μH] | k |
|---|---|---|---|
| PRESENT EMBODIMENT | 1.32 | 3.47 | 0.38 |
| COMPARATIVE EXAMPLE A | 1.73 | 4.86 | 0.50 |
| COMPARATIVE EXAMPLE B | 1.81 | 5.44 | 0.53 |
FIG. 9
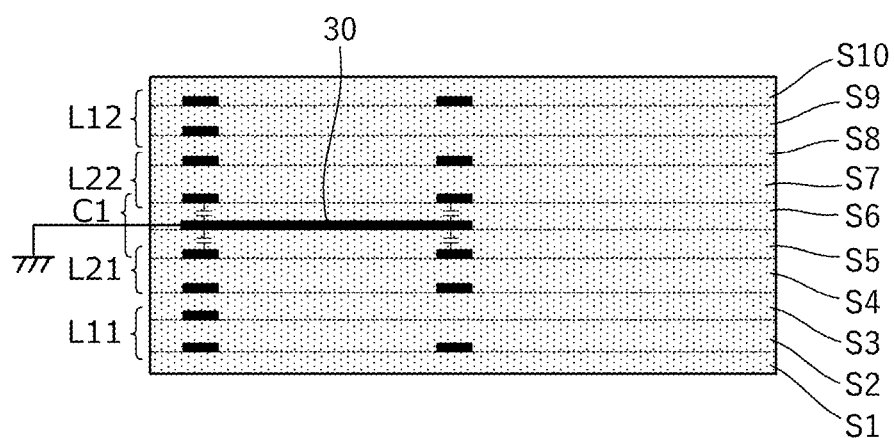

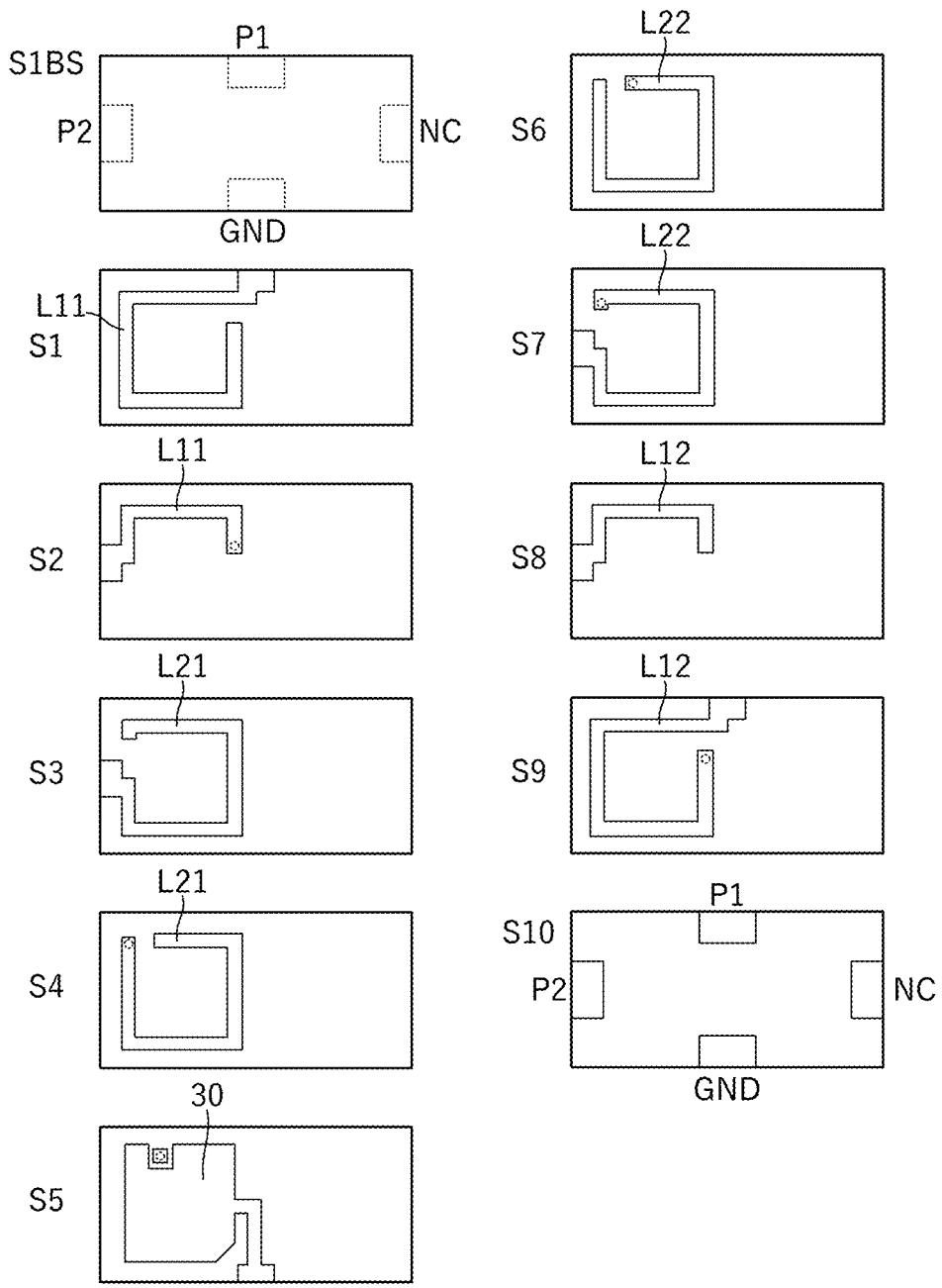

FILTER ELEMENT

CROSS REFERENCE TO RELATED APPLICATIONS

This application claims the benefit of priority to Japanese Patent Application No. 2018-110155 filed on Jun. 8, 2018 and is a Continuation Application of PCT Application No. PCT/JP2019/020695 filed on May 24, 2019. The entire contents of each application are hereby incorporated herein by reference.

BACKGROUND OF THE INVENTION

1. Field of the Invention

The present invention relates to a filter element including an inductor and a capacitor.

2. Description of the Related Art

An inductor and a capacitor have been provided in one filter element, such as a low pass filter, which is provided in a radio-frequency circuit. For example, as illustrated in FIG. 22A, an inductor L1 connected in series to a signal path and a capacitor C1 shunt-connected between the signal path and ground define a low pass filter.

International Publication No. 2016/167171 discloses a filter circuit including two inductors having a transformer (auto-transformer) structure in the circuit. In the filter circuit, the mutual inductance of the transformer is added to the inductors.

Effective use of such mutual inductance improves the passing loss (I·L) and increases the Q value of the filter.

The circuit illustrated in FIG. 22A in which the inductor L1 in the low pass filter includes a portion of the auto-transformer using the mutual inductance of the transformer in order to improve the passing loss (I·L) and increase the Q value of the filter is represented as, for example, a circuit illustrated in FIG. 22B. In the circuit in FIG. 22B, the inductor L1 is magnetically coupled to an inductor L2 to define the auto-transformer structure.

However, when a low pass filter that rejects, for example, a high band of 2.3 GHz or more in a mobile phone communication is provided, the inductance components of the inductors L1 and L2 in the low pass filter have low values of several nanohenries.

Although the number of turns of a conductive pattern defining the inductor is decreased in order to set the inductance of each of the inductors L1 and L2 to a low value, there is a limit to the number of turns, as described below. Specifically, there is a limit on the positions of input-output electrodes in a chip component and it is necessary to provide the input-output electrodes in central portions of the fours or at the four corners of a rectangular parallelepiped mounting surface. Accordingly, when the conductive pattern is routed to two input-output terminals that are opposed to each other and sufficient magnetic flux is to be formed, the conductive pattern of (N+0.5) turns (N is an integer of one or more here) is normally formed. In this case, the minimum number of turns is 1.5.

Consequently, a structure is considered in which multiple inductors are connected in parallel. However, since the multiple inductors that are connected in parallel are magnetically coupled to each other, the parallel connection is less effective in reducing combined inductance.

SUMMARY OF THE INVENTION

Preferred embodiments of the present invention provide filter elements that each include inductors and capacitors and that each include an inductor having low inductance.

A filter element according to a preferred embodiment of the present invention includes a first input-output terminal, a second input-output terminal, a ground terminal, a series inductor connected in series between the first input-output terminal and the second input-output terminal, a shunt inductor shunt-connected between a point between the first input-output terminal and the second input-output terminal and the ground terminal, and a capacitor connected in series to the shunt inductor. A multilayer body includes multiple insulating layers, conductive patterns provided along the insulating layers, and multiple interlayer connection conductors provided in the insulating layers. The capacitor is defined by capacitance occurring between the conductive patterns provided on different layers, among the multiple conductive patterns. The series inductor is defined by the conductive patterns of one or more layers, among the multiple conductive patterns, is wound around an axis along a lamination direction of the insulating layers, and includes a first opening surrounded by the conductive patterns defining the series inductor viewed from the lamination direction. The shunt inductor is defined by the conductive patterns of one or more layers, among the multiple conductive patterns, is wound around an axis along the lamination direction, and includes a second opening surrounded by the conductive patterns defining the shunt inductor viewed from the lamination direction. The shunt inductor includes a first shunt inductor and a second shunt inductor that are connected in parallel to each other. At least one conductive pattern defining the capacitor is overlapped with the first opening and the second opening viewed from the lamination direction. The capacitor is sandwiched between the first shunt inductor and the second shunt inductor in the lamination direction. The series inductor is magnetically coupled to the first shunt inductor. The first shunt inductor is sandwiched between the capacitor and the series inductor in the lamination direction.

With the above structure, the magnetic-field coupling between the first shunt inductor and the second shunt inductor is reduced or prevented without blocking the magnetic-field coupling between the series inductor and the shunt inductor. Accordingly, it is possible to effectively reduce the combined inductance caused by the parallel circuit of the first shunt inductor and the second shunt inductor while effectively using the mutual inductance caused by the magnetic-field coupling between the series inductor and the shunt inductor.

A filter element according to a preferred embodiment of the present invention includes a first input-output terminal, a second input-output terminal, a ground terminal, a series inductor connected in series between the first input-output terminal and the second input-output terminal, a shunt inductor shunt-connected between a point between the first input-output terminal and the second input-output terminal and the ground terminal, and a capacitor connected in series to the shunt inductor. A multilayer body includes multiple insulating layers, conductive patterns provided along the insulating layers, and multiple interlayer connection conductors provided in the insulating layers. The capacitor is defined by capacitance occurring between the conductive patterns provided on different layers, among the multiple conductive patterns. The series inductor is defined by the conductive patterns of one or more layers, among the multiple conductive patterns, is wound in a lamination direction of the insulating layers, and includes a first opening surrounded by the conductive patterns defining the series inductor viewed from the lamination direction. The shunt inductor is defined by the conductive patterns of one or more layers, among the multiple conductive patterns, is wound in the lamination direction, and includes a second opening surrounded by the conductive patterns defining the shunt inductor viewed from the lamination direction. The series inductor includes a first series inductor and a second series inductor that are connected in parallel to each other. At least one conductive pattern defining the capacitor is overlapped with the first opening and the second opening viewed from the lamination direction. The capacitor is sandwiched between the first series inductor and the second series inductor in the lamination direction of the insulating layers and the conductive patterns. The shunt inductor is magnetically coupled to the first series inductor. The first series inductor is sandwiched between the capacitor and the shunt inductor in the lamination direction.

With the above structure, the magnetic-field coupling between the first series inductor and the second series inductor is reduced or prevented without blocking the magnetic-field coupling between the series inductor and the shunt inductor. Accordingly, it is possible to effectively reduce the combined inductance caused by the parallel circuit of the first series inductor and the second series inductor while effectively using the mutual inductance caused by the magnetic-field coupling between the series inductor and the shunt inductor.

According to preferred embodiments of the present invention, it is possible to provide filter elements that each include inductors and capacitors and that each include an inductor having low inductance.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7 is a diagram illustrating the positions of interlayer connection portions between capacitor conductive patterns and inductor conductive patterns.

FIG. 8 is a table indicating the characteristics of the filter element 101 according to the first preferred embodiment of the present invention and filter elements of comparative examples.

FIG. 9 illustrates a vertical cross section of a filter element 102 according to a second preferred embodiment of the present invention.

FIG. 10 is a plan view of multiple insulating layers of the filter element 102.

DETAILED DESCRIPTION OF THE PREFERRED EMBODIMENTS

Figure 1:
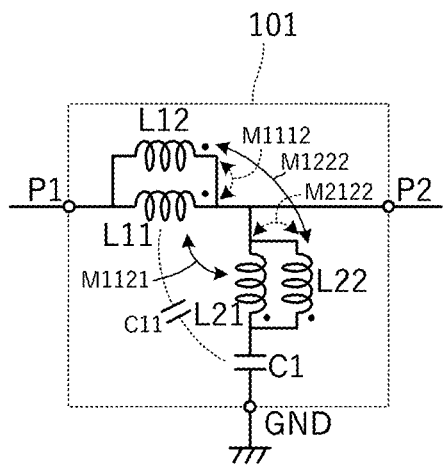
FIG. 1 is a circuit diagram of a filter element 101 according to a first preferred embodiment of the present invention.

Preferred embodiments of the present invention will herein be described using several specific examples with reference to the drawings. The same reference numerals are used in the drawings to identify the same or similar components. Although the preferred embodiments are separately described for convenience in consideration of description of the point or the ease of understanding, partial replacement or combination of components described in different preferred embodiments may be provided. Description of matters common to a first preferred embodiment of the present invention is omitted and only points different from the first preferred embodiment are described in a second preferred embodiment and the subsequent preferred embodiments. In particular, similar effects and advantages of similar components are not sequentially described in each preferred embodiment.

First Preferred Embodiment

Figure 2:
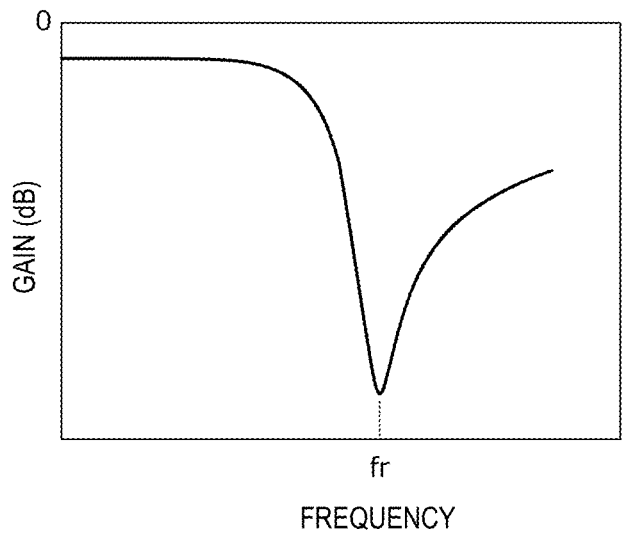
FIG. 2 is a graph indicating a frequency characteristic of the insertion loss of the filter element 101.

FIG. 1 is a circuit diagram of a filter element 101 according to a first preferred embodiment of the present invention. FIG. 2 is a graph indicating a frequency characteristic of the insertion loss of the filter element 101.

The filter element 101 includes input-output terminals P1 and P2 and a ground terminal GND. The input-output terminals P1 and P2 are provided in series on a signal path and the ground terminal GND is grounded.

In the filter element 101, inductors L11 and L12 that are connected in parallel to each other are connected in series to the signal path. In addition, a series circuit including a parallel circuit of inductors L21 and L22 that are connected in parallel to each other and a capacitor C1 is shunt-connected between the signal path and ground.

The inductors L11 and L12 correspond to "series inductors" and the inductors L21 and L22 correspond to "shunt inductors". The inductor L11 corresponds to a "first series inductor" and the inductor L12 corresponds to a "second series inductor". Similarly, the inductor L21 corresponds to a "first shunt inductor" and the inductor L22 corresponds to a "second shunt inductor".

Due to the structure described below, the first series inductor L11 is magnetically coupled to the first shunt inductor L21 and the second series inductor L12 is magnetically coupled to the second shunt inductor L22.

Referring to FIG. 2, a frequency fr is the resonant frequency of a resonant circuit that is shunt-connected between the signal path and the ground and that is includes the inductors L21 and L22 and the capacitor C1. As indicated in FIG. 2, the gain is decreased as the frequency comes closer to the resonant frequency to cause the filter element 101 to function as a filter.

Figure 3:
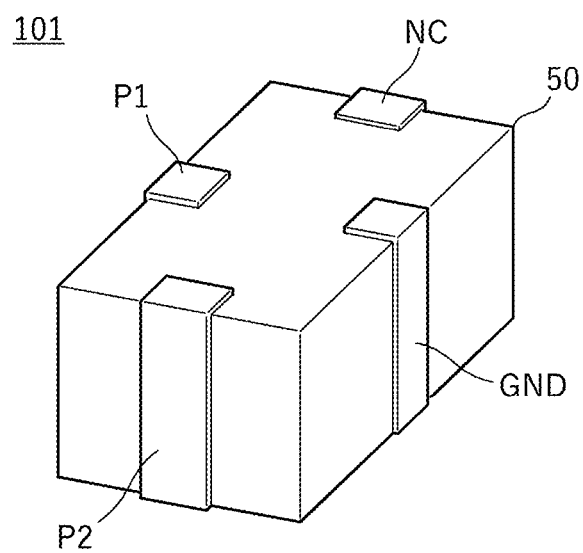
FIG. 3 is an external perspective view of the filter element 101.

FIG. 3 is an external perspective view of the filter element 101. The main portion of the filter element 101 is defined by a rectangular or substantially rectangular parallelepiped multilayer body 50. The filter element 101 includes the first input-output terminal P1, the second input-output terminal P2, the ground terminal GND, and a free terminal (a terminal that is not connected to the circuit) NC on the outer surface of the multilayer body 50. A conductor with which the input-output terminal P1 on the top and bottom surfaces of the multilayer body 50 is connected, a conductor with which the input-output terminal P2 on the top and bottom surfaces of the multilayer body 50 is connected, a conductor with which the ground terminal GND on the top and bottom surfaces of the multilayer body 50 is connected, and a conductor with which the free terminal NC on the top and bottom surfaces of the multilayer body 50 is connected are provided on the surfaces of the multilayer body 50.

Figure 4:
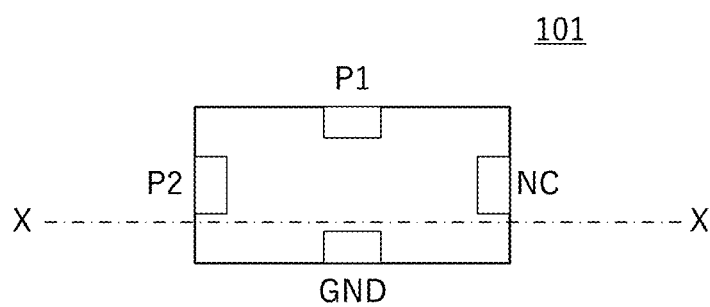
FIG. 4 is a plan view of the filter element 101.
Figure 5:
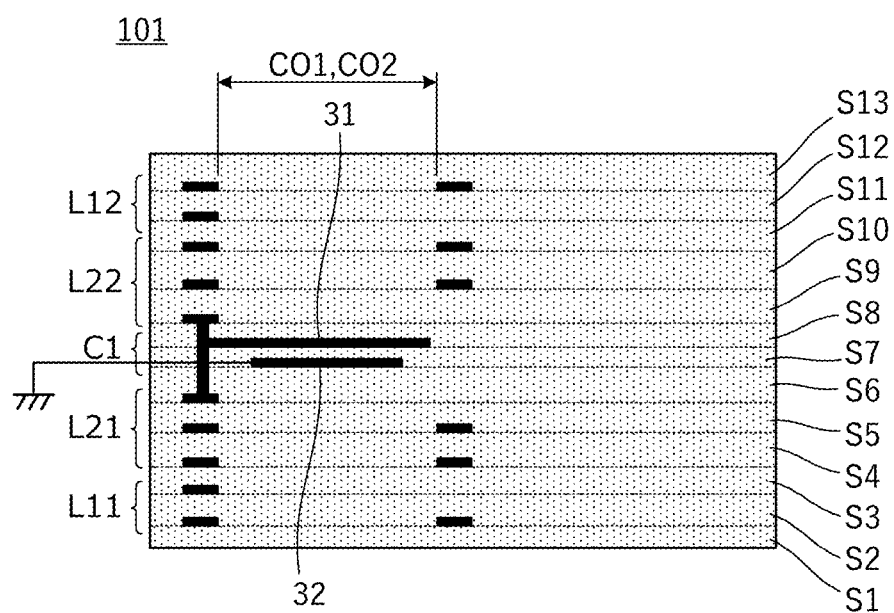
FIG. 5 illustrates a vertical cross section of the filter element 101 in FIG. 4, which is taken along an alternate long and short dash line X-X.
Figure 6:
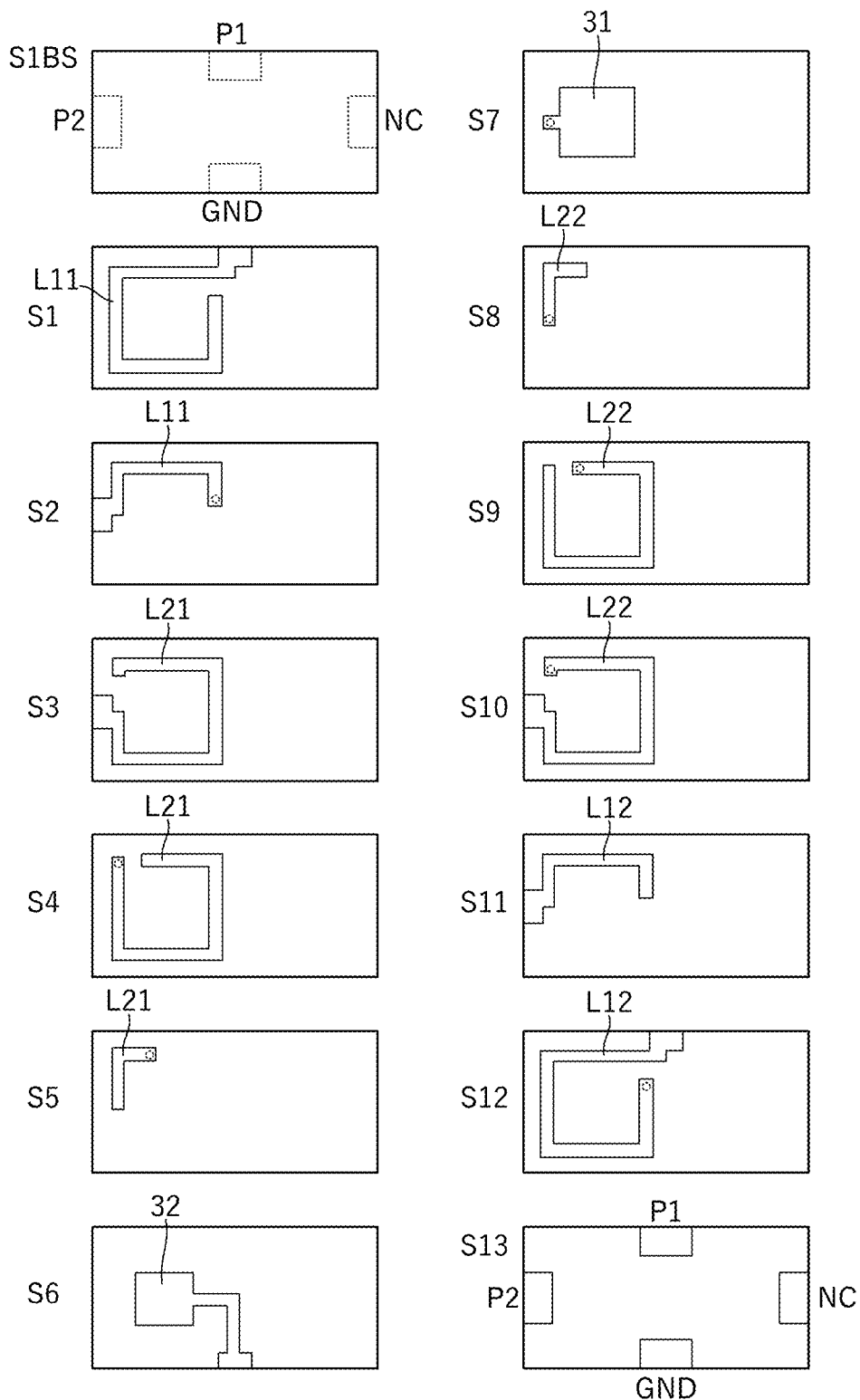
FIG. 6 is a plan view of multiple insulating layers of the filter element 101.

FIG. 4 is a plan view of the filter element 101. FIG. 5 illustrates a vertical cross section of the filter element 101 in FIG. 4, which is taken along an alternate long and short dash line X-X. FIG. 6 is a plan view of multiple insulating layers of the filter element 101. FIG. 7 is a diagram illustrating the positions of interlayer connection portions between capacitor conductive patterns and inductor conductive patterns.

Referring to FIG. 5 and FIG. 6, the inductor conductive patterns and the capacitor conductive patterns are formed on the upper surfaces of insulating layers S1 to S12. An insulating layer SIBS represents the conductive pattern on the lower surface of the insulating layer S1 in FIG. 6. The input-output terminals P1 and P2, the ground terminal GND, and the free terminal NC are provided on the lower surface of the insulating layer S1 and the upper surface of an insulating layer S13. The first series inductor L11 is provided on the upper surfaces of the insulating layers S1 and S2, and the first shunt inductor L21 is provided on the upper surfaces of the insulating layers S3 to S5. The second shunt inductor L22 is formed on the upper surfaces of the insulating layers S8 to S10 and the second series inductor L12 is formed on the upper surfaces of the insulating layers S11 and S12. A capacitor conductive pattern 32 is provided on the upper surface of the insulating layer S6, and a capacitor conductive pattern 31 is provided on the upper surface of the insulating layer S7. Broken-line circles in FIG. 6 illustrate interlayer connection conductors (vias).

As described above, the first series inductor L11 is provided in the two layers and the two layers of the first series inductor L11 are connected with the interlayer connection conductor. The first shunt inductor L21 is provided in the three layers and the three layers of the first shunt inductor L21 are connected with the interlayer connection conductors. Similarly, the second series inductor L12 is provided in the two layers and the two layers of the second series inductor L12 are connected with the interlayer connection conductor. The second shunt inductor L22 is provided in the three layers and the three layers of the second shunt inductor L22 are connected with the interlayer connection conductors.

Each of the first series inductor L11, the first shunt inductor L21, the second shunt inductor L22, and the second series inductor L12 is defined by rectangular or substantially rectangular coil-shaped conductive patterns that are wound around an axis along a lamination direction of the insulating layers. In this example, the size of a first opening CO1 surrounded by the conductive patterns defining the first series inductor L11 and the second series inductor L12 is preferably the same or substantially the same as the size of a second opening CO2 surrounded by the conductive patterns defining the first shunt inductor L21 and the second shunt inductor L22, and the first opening CO1 is overlapped with the second opening CO2 viewed from the lamination direction of the insulating layers. In addition, the winding axes of all of the first series inductor L11, the first shunt inductor L21, the second shunt inductor L22, and the second series inductor L12 are preferably in a coaxial relationship.

The capacitor conductive patterns 31 and 32 are overlapped with the first opening CO1 surrounded by the conductive patterns defining the series inductors L11 and L12 and the second opening CO2 surrounded by the conductive patterns defining the shunt inductors L21 and L22 viewed from the lamination direction of the insulating layers.

As illustrated in FIG. 5 and FIG. 6, since the capacitor conductive patterns 31 and 32 are disposed between the opening surrounded by the conductive patterns defining the first shunt inductor L21 and the opening surrounded by the conductive patterns defining the second shunt inductor L22, the magnetic-field coupling between the first shunt inductor L21 and the second shunt inductor L22 is reduced or prevented. In other words, mutual inductance M2122 illustrated in FIG. 1 is very small. Similarly, since the capacitor conductive patterns 31 and 32 are disposed between the opening surrounded by the conductive patterns defining first series inductor L11 and the opening surrounded by the conductive patterns defining the second series inductor L12, the magnetic-field coupling between the first series inductor L11 and the second series inductor L12 is reduced or prevented. In other words, mutual inductance M1112 illustrated in FIG. 1 is very small.

In contrast, the capacitor conductive patterns 31 and 32 do not block the coupling between the first series inductor L11 and the first shunt inductor L21 and the coupling between the second series inductor L12 and the second shunt inductor L22.

With the structure described above, the coupling between the first series inductor L11 and the first shunt inductor L21 causes mutual inductance M1121 and the coupling between the second series inductor L12 and the second shunt inductor L22 causes mutual inductance M1222, as illustrated in FIG. 1. A portion of combined inductance of the series inductors L11 and L12 and combined inductance of the shunt inductors L21 and L22 is capable of being provided by the mutual inductances M1121 and M1222. Since the mutual inductance ial reactance, the Q values of the respective combined inductances are capable of being increased. In addition, the line lengths of the conductive patterns defining the inductors L11, L12, L21, and L22 are capable of being decreased by the amounts replaced by the mutual inductances. This reduces the resistance components of the inductors L11, L12, L21, and L22 to reduce or prevent the power loss.

As illustrated in FIG. 5, the capacitor conductive pattern 32 is connected to the ground terminal GND. In other words, the capacitor conductive pattern 32 is grounded. The conductive pattern closest to the capacitor C1, among the conductive patterns defining the first shunt inductor L21, is electrically connected to the conductive pattern 31 that is not grounded, among the capacitor conductive patterns. The conductive pattern closest to the capacitor C1, among the conductive patterns defining the second shunt inductor L22, is electrically connected to the conductive pattern 31 that is not grounded, among the capacitor conductive patterns. The capacitor conductive patterns 31 and 32 are opposed to each other in the lamination direction of the insulating layers to provide capacitance.

The insulating layers S1 to S13 with the conductive patterns provided thereon are laminated to define the multilayer body 50 illustrated in FIG. 3. The multilayer body 50 has a structure in which the first series inductor L11, the first shunt inductor L21, the capacitor C1, the second shunt inductor L22, and the second series inductor L12 are sequentially laminated from the bottom layer in the lamination state illustrated in FIG. 5.

Referring to FIG. 1, a capacitor C11 represents parasitic capacitance occurring between the first series inductor L11 and the second series inductor L12 and the capacitor conductive patterns 31 and 32. As illustrates in FIG. 5, since the first series inductor L11 and the second series inductor L12 are spaced apart from the capacitor conductive patterns 31 and 32, the parasitic capacitance C11 is sufficiently reduced or prevented. Accordingly, unnecessary variation of low pass filter characteristics due to the parasitic capacitance is reduced or prevented. In addition, since the first shunt inductor L21 and the second shunt inductor L22 are close to the capacitor conductive patterns 31 and 32, paths connecting the first shunt inductor L21 and the second shunt inductor L22 to the capacitor conductive patterns 31 and 32 are shortened to reduce or prevent equivalent series inductance ESL caused by the paths. In addition, since the difference in voltage between the conductive patterns defining the first shunt inductor L21 and the conductive patterns defining the second shunt inductor L22 is small, the conductive patterns close to each other reduce or prevent the parasitic capacitance that is not intended.

In the present preferred embodiment, since the grounded conductive pattern 32, among the capacitor conductive patterns 31 and 32, is positioned toward a mounting surface of the filter element 101, as illustrated in FIG. 5, the capacitance of the capacitor C1 is stabilized regardless of the mounting state of the filter element 101. Here, the mounting surface is, for example, a surface with which the filter element 101 is mounted on an external circuit element, such as a printed wiring board.

In addition, in the present preferred embodiment, the spacing between the first shunt inductor L21 and the capacitor conductive patterns 31 and 32 is equal or substantially equal to the spacing between the second shunt inductor L22 and the capacitor conductive patterns 31 and 32, as illustrated in FIG. 5. Accordingly, the parasitic capacitance occurring between the first shunt inductor L21 and the capacitor conductive patterns 31 and 32 is equal or substantially equal to the parasitic capacitance occurring between the second shunt inductor L22 and the capacitor conductive patterns 31 and 32 to enable the characteristics of the two parallel-connected inductors L21 and L22 to be uniformed.

In the present preferred embodiment, although the capacitor conductive pattern 31 is connected to the second shunt inductor L22 using an interlayer connection conductor (via) V, as illustrated in FIG. 7, the interlayer connection conductor (via) V is positioned in an outer portion of the coil opening portion. Accordingly, since the path of magnetic flux contributing to the coupling between the first series inductor L11 and the first shunt inductor L21 is not blocked by the interlayer connection conductor, the coupling coefficient between the first series inductor L11 and the first shunt inductor L21 is not reduced due to the interlayer connection conductor. Similarly, the coupling coefficient between the second series inductor L12 and the second shunt inductor L22 is not reduced due to the interlayer connection conductor.

Although the state is illustrated in FIG. 3 in which the filter element 101 is cut out as a single filter element and the respective terminals are provided on the filter element, a multiple-cavity mold is used in manufacturing of the filter element. Specifically, after the conductive patterns for forming the filter element are formed in multiple partitions that are horizontally and longitudinally arranged of multiple base materials in a mother state and a multilayer body of the base materials are formed, each element is cut out from the multilayer body for separation.

In the structure of the filter element 101 illustrated in FIG. 5 and FIG. 6, the capacitor conductive patterns 31 and 32 are opposed to each other with the insulating layer S7 interposed therebetween. Accordingly, the capacitor conductive patterns 31 and 32 define the capacitor C1 (refer to FIG. 1). In addition, the first series inductor L11 is magnetically coupled to the first shunt inductor L21 and the second series inductor L12 is magnetically coupled to the second shunt inductor L22. Since the capacitor conductive patterns 31 and 32 are disposed between the first shunt inductor L21 and the second shunt inductor L22, the magnetic-field coupling between the first shunt inductor L21 and the second shunt inductor L22 is reduced or prevented.

Figure 23A:
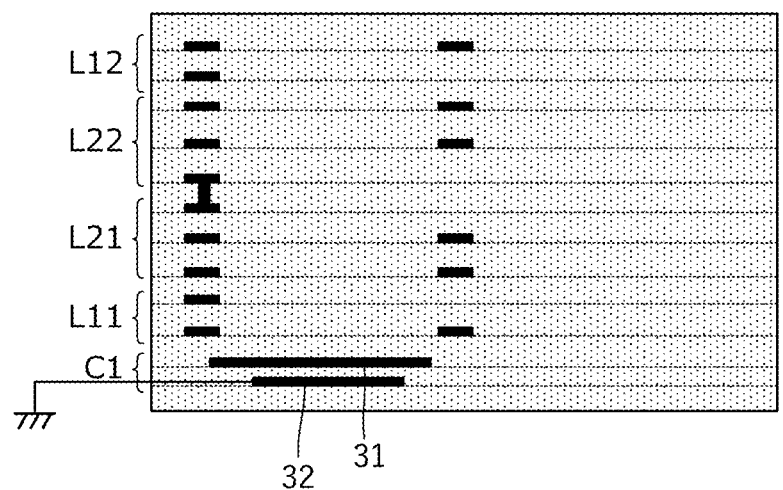
FIGS. 23A and 23B are cross-sectional views of the filter elements of comparative examples of a preferred embodiment of the present invention.
Figure 23B:
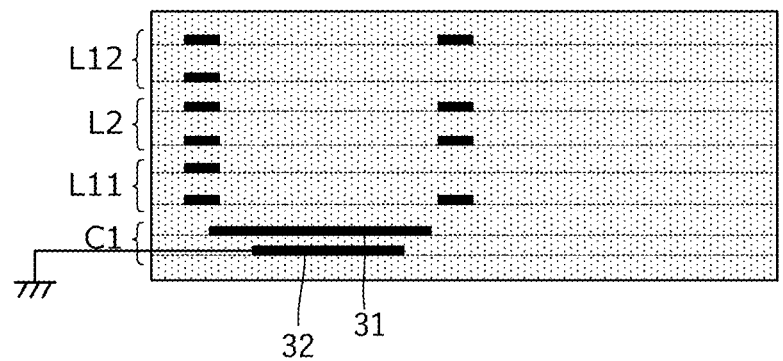

FIGS. 23A and 23B are cross-sectional views of filter elements of comparative examples of the present preferred embodiment. The filter element of the comparative example illustrated in FIG. 23A differs from the filter element 101 illustrated in FIG. 5 in the positions of the capacitor conductive patterns 31 and 32 defining the capacitor C1. In the filter element of the comparative example illustrated in FIG. 23A, the capacitor C1 is provided in the outer portion of the portion where the inductors L12, L22, L21, and L11 are laminated. In the filter element of the comparative example illustrated in FIG. 23B, the first shunt inductor is not connected in parallel to the second shunt inductor and the shunt inductors are defined by the single shunt inductor L2.

FIG. 8 is a table indicating the characteristics of the filter element 101 of the present preferred embodiment and the filter elements of the comparative examples described above. Here, L1 denotes the combined self-inductance of the series inductors and L2 denotes the combined self-inductance of the shunt inductor(s). A coefficient k denotes the coupling coefficient between the series inductor L1 and the shunt inductor L2. COMPARATIVE EXAMPLE A indicates the filter element of the comparative example illustrated in FIG. 23A and COMPARATIVE EXAMPLE B indicates the filter element of the comparative example illustrated in FIG. 23B. Since the two inductors L21 and L22 are connected in parallel to each other in the shunt inductor of COMPARATIVE EXAMPLE A, the self-inductance of the shunt inductor of COMPARATIVE EXAMPLE A is smaller than the self-inductance of the shunt inductor L2 of COMPARATIVE EXAMPLE B. However, the inductance of the shunt inductor L2 has a value resulting from the addition of the mutual inductances of the first shunt inductor L21 and the second shunt inductor L22. In contrast, in the filter element of the present preferred embodiment, since the capacitor conductive patterns 31 and 32 are disposed between the first shunt inductor L21 and the second shunt inductor L22, the magnetic-field coupling between the first shunt inductor L21 and the second shunt inductor L22 is blocked to decrease the coupling coefficient k to about 0.38. In accordance with the decrease in the coupling coefficient k, the influence of the mutual inductance between the parallel-connected inductors is reduced and the inductance of the shunt inductor L2 is decreased by about 1.4 nH, compared with that of COMPARATIVE EXAMPLE A. The ratio of the inductance of the shunt inductor L2 of the present preferred embodiment to the inductance of the shunt inductor L2 of COMPARATIVE EXAMPLE A is decreased to a value of 3.47/4.86=0.714.

Since the capacitor conductive patterns 31 and 32 are also disposed between the first series inductor L11 and the second series inductor L12, the parallel connection of the two inductors is highly effective in reducing the inductance. Since the magnetic-field coupling between the first series inductor L11 and the first shunt inductor L21 and the magnetic-field coupling between the second series inductor L12 and the second shunt inductor L22 are less likely to be inhibited, the mutual inductance between the first series inductor L11 and the first shunt inductor L21 and the mutual inductance between the second series inductor L12 and the second shunt inductor L22 are capable of being maintained. Accordingly, in the present preferred embodiment, it is possible to obtain the filter element having a low L value and a high Q value.

Second Preferred Embodiment

An example of a filter element is described in a second preferred embodiment of the present invention, which includes capacitor conductive patterns different from those in the first preferred embodiment.

FIG. 9 illustrates a vertical cross section of a filter element 102 according to the second preferred embodiment. FIG. 10 is a plan view of multiple insulating layers of the filter element 102.

Referring to FIG. 10, the inductor conductive patterns and the capacitor conductive patterns are provided on the upper surfaces of the insulating layers S1 to S10. The insulating layer SIBS represents the conductive pattern on the lower surface of the insulating layer S1 in FIG. 10. The input-output terminals P1 and P2, the ground terminal GND, and the free terminal NC are provided on the lower surface of the insulating layer S1 and the upper surface of the insulating layer S10. The first series inductor L11 is provided on the upper surfaces of the insulating layers S1 and S2, and the first shunt inductor L21 is provided on the upper surfaces of the insulating layers S3 and S4. The second shunt inductor L22 is provided on the upper surfaces of the insulating layers S6 and S7, and the second series inductor L12 is provided on the upper surfaces of the insulating layers S8 and S9. A capacitor conductive pattern 30 is provided on the upper surface of the insulating layer S5. Broken-line circles in FIG. 10 illustrate the interlayer connection conductors (vias).

As described above, all of the first series inductor L11, the first shunt inductor L21, the second series inductor L12, and the second shunt inductor L22 are provided in the two layers and the respective two layers are connected with the interlayer connection conductors.

All of the first series inductor L11, the first shunt inductor L21, the second shunt inductor L22, and the second series inductor L12 have rectangular or substantially rectangular coil shapes and include the coil opening portions. The capacitor conductive pattern 30 is overlapped with the coil opening portions of the series inductors L11 and L12 and the shunt inductors L21 and L22, viewed from the lamination direction of the insulating layers.

As illustrated in FIG. 9, the capacitor conductive pattern 30 is connected to the ground terminal GND. In other words, the capacitor conductive pattern 30 is grounded. Capacitance is provided between the conductive pattern closest to the capacitor conductive pattern 30, among the conductive patterns defining the first shunt inductor L21, and the capacitor conductive pattern 30. Capacitance is provided between the conductive pattern closest to the capacitor conductive pattern 30, among the conductive patterns defining the second shunt inductor L22, and the capacitor conductive pattern 30.

As described in the present preferred embodiment, the capacitor C1 may preferably be the capacitances occurring between the capacitor conductive pattern 30 and the conductive patterns of the shunt inductors.

Third Preferred Embodiment

Circuits are described in a third preferred embodiment of the present invention, in which another filter circuit is connected downstream of a filter element defining and functioning as a low pass filter.

Figure 11A:
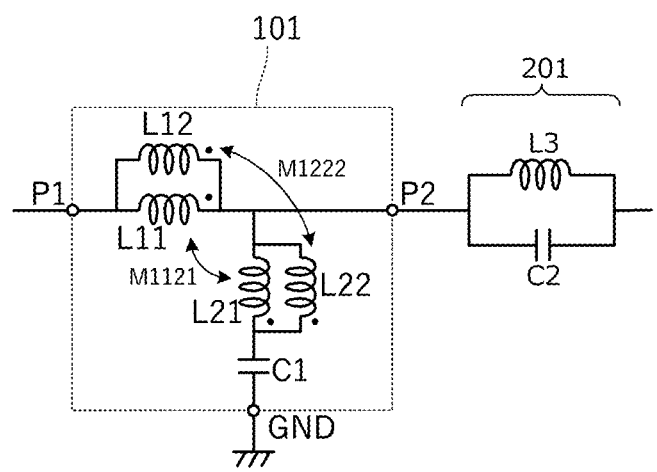
FIG. 11A is a circuit diagram of a circuit in which a band elimination filter 201 is connected downstream of the filter element 101 and FIG. 11B is a circuit diagram explicitly indicating mutual inductance occurring in the filter element 101 as a circuit element.
Figure 11B:
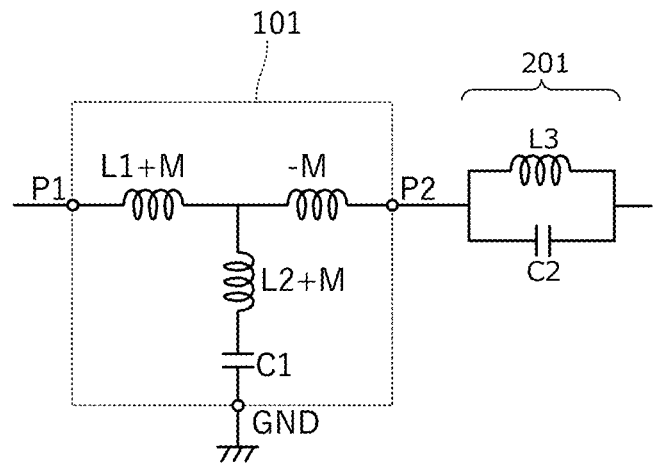

FIG. 11A is a circuit diagram of a circuit in which a band elimination filter 201 is connected downstream of the filter element 101. FIG. 11B is a circuit diagram explicitly indicating the mutual inductance occurring in the filter element 101 as a circuit element.

Figure 12A:
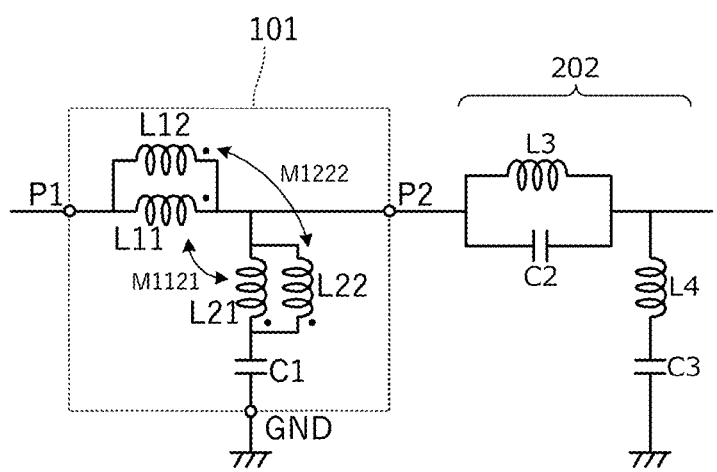
FIG. 12A is a circuit diagram of a circuit in which a band elimination filter 202 is connected downstream of the filter element 101 and FIG. 12B is a circuit diagram explicitly indicating the mutual inductance occurring in the filter element 101 as a circuit element.
Figure 12B:
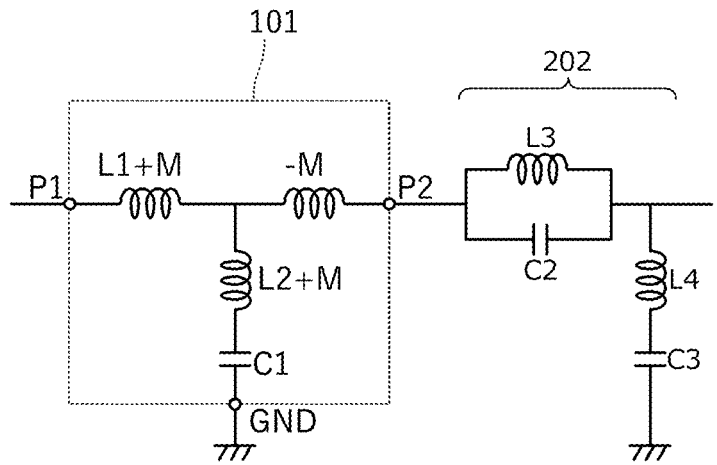

FIG. 12A is a circuit diagram of a circuit in which a band elimination filter 202 is connected downstream of the filter element 101. FIG. 12B is a circuit diagram explicitly indicating the mutual inductance occurring in the filter element 101 as a circuit element.

The band elimination filter 201 is a circuit in which a parallel circuit of an inductor L3 and a capacitor C2 is connected in series to the signal path. The band elimination filter 202 is a circuit in which the parallel circuit of the inductor L3 and the capacitor C2 is connected in series to the signal path and a series connection circuit of an inductor L4 and a capacitor C3 is shunt-connected between the signal path and the ground.

As illustrated in FIG. 11A and FIG. 12A, the coupling between the first series inductor L11 and the first shunt inductor L21 causes the mutual inductance M1121 and the coupling between the second series inductor L12 and the second shunt inductor L22 causes the mutual inductance M1222.

Referring to FIG. 11B and FIG. 12B, mutual inductance M results from a combination of the mutual inductance M1121 and the mutual inductance M1222. The mutual inductance M is represented by the relationship of M=k√(L1*L2) where the combined inductance of the series inductors L11 and L12 is denoted by L1, the combined inductance of the shunt inductors L21 and L22 is denoted by L2, and the coupling coefficient between the combined inductance L1 and the combined inductance L2 is dented by k.

As illustrated in FIG. 11B and FIG. 12B, negative inductance (−M) is connected in series to the band elimination filters 201 and 202, respectively.

Here, the absolute value IMI of the above negative inductance (−M) should have a value lower than L(BSF), where a series inductance component of each of the band elimination filters 201 and 202 is denoted by L(BSF).

However, the series inductance component of the band elimination filter that rejects, for example, a high band of about 2.3 GHz or more in mobile phone communication has a low value of several nanohenries. In order to decrease the absolute value of the negative inductance (−M) described above, it is necessary to set the inductances of the series inductors L11 and L12 and the shunt inductors L21 and L22 to lower values. As described above, according to the present preferred embodiment, since the inductances of the series inductor L1 and the shunt inductor L2 are capable of being effectively decreased, the characteristics of the band elimination filter are not degraded also when the band elimination filter having a high stopband is connected downstream of the filter element.

Figure 13:
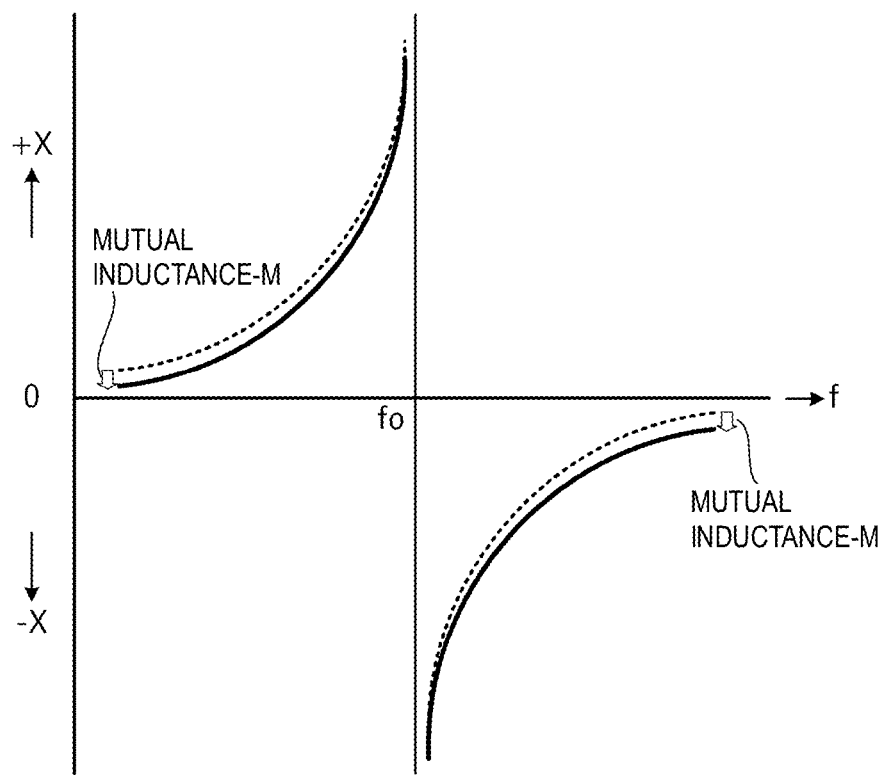
FIG. 13 is a graph indicating a frequency characteristic of the reactance of the band elimination filter 201 and illustrates the effect of the mutual inductance occurring in the filter element 101.

In addition, according to the present preferred embodiment, the addition of the negative inductance to the band elimination filter reduces the inductive reactance of the band elimination filter. This advantageous effect is described here with reference to FIG. 13. FIG. 13 is a graph indicating a frequency characteristic of the reactance of the parallel resonant circuit defining the band elimination filter. As indicated in FIG. 13, the reactance of the parallel resonant circuit is increased with the increasing frequency from a frequency sufficiently lower than the resonant frequency and sharply rises near the resonant frequency. The reactance of the parallel resonant circuit is decreased with the decreasing frequency from a frequency sufficiently higher than the resonant frequency and sharply falls near the resonant frequency.

Accordingly, the inductive reactance in the frequency domain lower than the resonant frequency is capable of being decreased and the absolute value of the inductive reactance in the frequency domain higher than the resonant frequency is capable of being increased with little variation of the resonant frequency of the band elimination filter as a result of the advantageous effect of reducing the reactance. Accordingly, it is possible to broaden the stopband of the band elimination filter.

Fourth Preferred Embodiment

An example of a filter element is described according to a fourth preferred embodiment of the present invention, which differs from the filter elements described above in the configuration of the series inductor.

Figure 14:
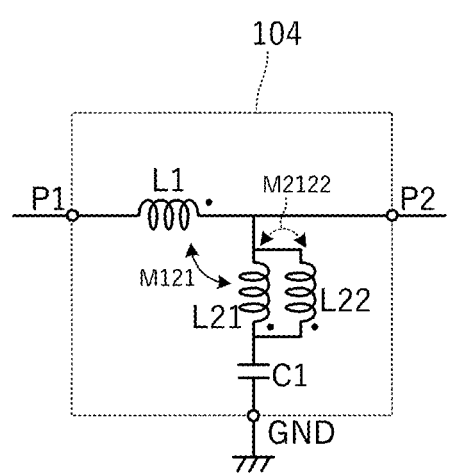
FIG. 14 is a circuit diagram of a filter element 104 according to a fourth preferred embodiment of the present invention.

FIG. 14 is a circuit diagram of a filter element 104 according to the fourth preferred embodiment. In the filter element 104, the series inductor L1 is connected in series to the signal path. A series circuit defined by the parallel circuit of the inductors L21 and L22 that are connected in parallel to each other and the capacitor C1 is shunt-connected between the signal path and the ground.

Figure 15:
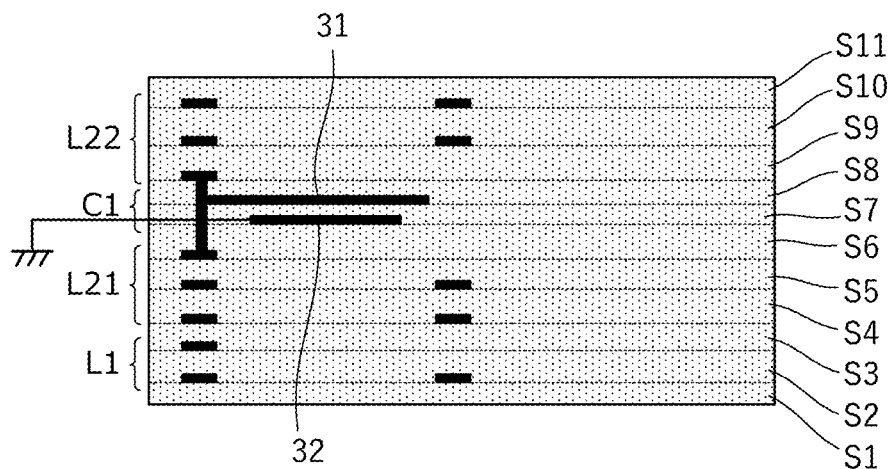
FIG. 15 is a vertical cross-sectional view of the filter element 104.

FIG. 15 is a vertical cross-sectional view of the filter element 104. The filter element 104 has a structure in which the series inductor L1, the first shunt inductor L21, the capacitor C1, and the second shunt inductor L22 are sequentially laminated from the bottom layer.

As illustrated in FIG. 15, since the capacitor conductive patterns 31 and 32 are disposed between the opening surrounded by the conductive patterns defining first shunt inductor L21 and the opening surrounded by the conductive patterns defining the second shunt inductor L22, the magnetic-field coupling between the first shunt inductor L21 and the second shunt inductor L22 is reduced or prevented. In other words, the mutual inductance M2122 illustrated in FIG. 14 is very small.

In contrast, since the capacitor conductive patterns 31 and 32 do not block the coupling between the series inductor L1 and the first shunt inductor L21, the series inductor L1 is magnetically coupled to the first shunt inductor L21 to cause mutual inductance M121, as illustrated in FIG. 14.

The remaining configuration is the same or substantially the same as that of the filter element 101 described in the first preferred embodiment. Also in the filter element of the present preferred embodiment, since the capacitor conductive patterns 31 and 32 are disposed between the first shunt inductor L21 and the second shunt inductor L22, the magnetic-field coupling between the first shunt inductor L21 and the second shunt inductor L22 is reduced or prevented to improve the effect of reducing the inductance due to the parallel connection of the two inductors. In addition, the magnetic-field coupling between the series inductor L1 and the first shunt inductor L21 enables the Q value of the series inductor L1 itself to be increased.

Fifth Preferred Embodiment

An example of a filter element is described according to a fifth preferred embodiment of the present invention, which differs from the filter elements described above in the configuration of the shunt inductor.

Figure 16:
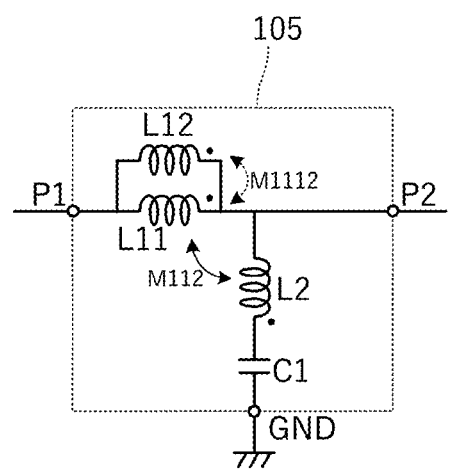
FIG. 16 is a circuit diagram of a filter element 105 according to a fifth preferred embodiment of the present invention.

FIG. 16 is a circuit diagram of a filter element 105 according to the fifth preferred embodiment. In the filter element 105, the parallel circuit of the inductors L11 and L12 that are connected in parallel to each other is connected in series to the signal path. A series circuit of the shunt inductor L2 and the capacitor C1 is shunt-connected between the signal path and the ground.

Figure 17:
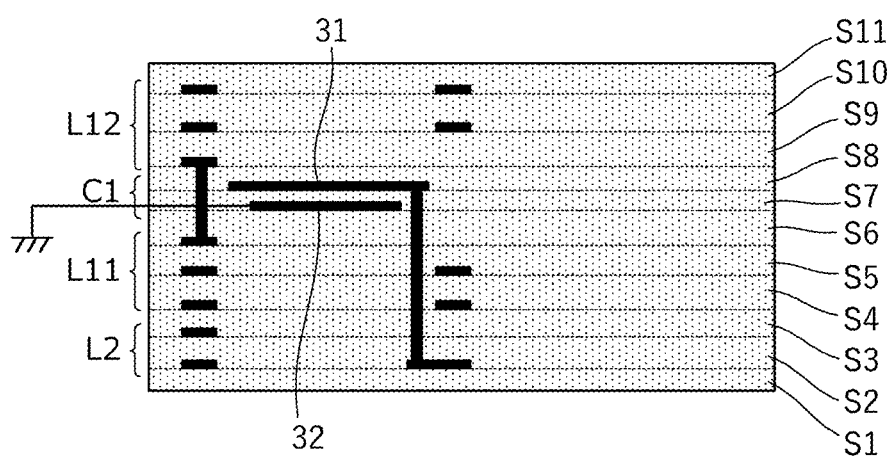
FIG. 17 is a vertical cross-sectional view of the filter element 105.

FIG. 17 is a vertical cross-sectional view of the filter element 105. The filter element 105 has a structure in which the shunt inductor L2, the first series inductor L11, the capacitor C1, and the second series inductor L12 are sequentially laminated from the bottom layer.

The shunt inductor L2 is magnetically coupled to the first series inductor L11 to cause mutual inductance M112, as illustrated in FIG. 16.

The remaining configuration is the same or substantially the same as that of the filter element 101 described in the first preferred embodiment. In the filter element of the present preferred embodiment, since the capacitor conductive patterns 31 and 32 are disposed between the first series inductor L11 and the second series inductor L12, the magnetic-field coupling between the first series inductor L11 and the second series inductor L12 is reduced or prevented to improve the effect of reducing the inductance due to the parallel connection of the two inductors. In addition, the magnetic-field coupling between the first series inductor L11 and the shunt inductor L2 enables the Q value of the first series inductor L11 itself to be increased.

Sixth Preferred Embodiment

A filter element is described according to a sixth preferred embodiment of the present invention, which differs from the examples described above in the connection relationship between the shunt inductors and the capacitor, which are connected between the signal path and the ground.

Figure 18:
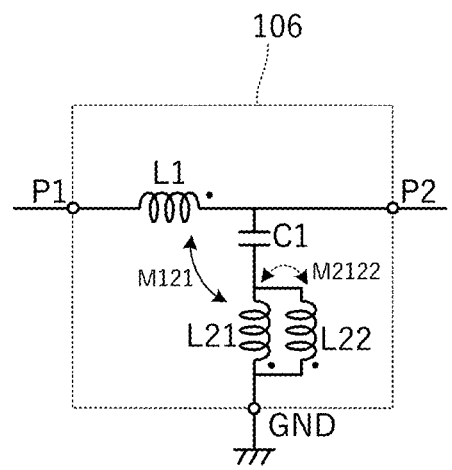
FIG. 18 is a circuit diagram of a filter element 106 according to a sixth preferred embodiment of the present invention.

FIG. 18 is a circuit diagram of a filter element 106 according to the sixth preferred embodiment. In the filter element 106, the series inductor L1 is connected in series to the signal path. A series circuit defined by the inductors L21 and L22 that are connected in parallel to each other and the capacitor C1 is shunt-connected between the signal path and the ground.

Figure 19:
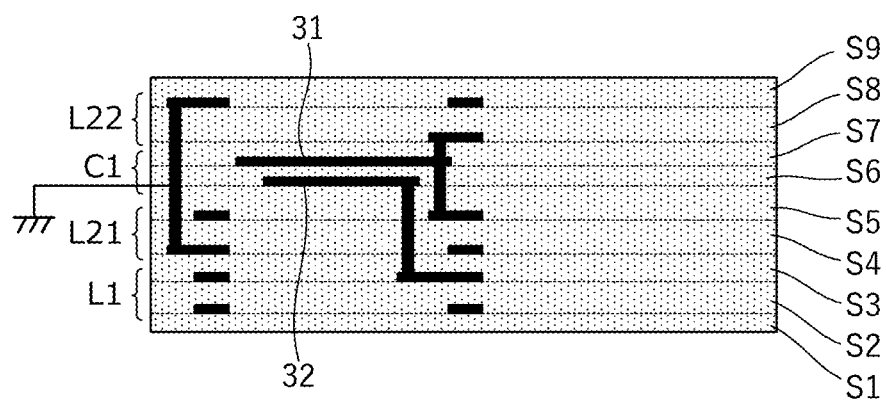
FIG. 19 is a vertical cross-sectional view of the filter element 106.

FIG. 19 is a vertical cross-sectional view of the filter element 106. The filter element 106 has a structure in which the series inductor L1, the first shunt inductor L21, the capacitor C1, and the second shunt inductor L22 are sequentially laminated from the bottom layer.

The series inductor L1 is magnetically coupled to the first shunt inductor L21 to cause the mutual inductance M121, as illustrated in FIG. 18.

The remaining configuration is the same or substantially the same as that of the filter element 101 described in the first preferred embodiment. In the filter element of the present preferred embodiment, since the capacitor conductive patterns 31 and 32 are disposed between the first shunt inductor L21 and the second shunt inductor L22, the magnetic-field coupling between the first shunt inductor L21 and the second shunt inductor L22 is reduced or prevented to improve the effect of reducing the inductance owing to the parallel connection of the two inductors. In addition, the magnetic-field coupling between the series inductor L1 and the first shunt inductor L21 enables the Q value of the series inductor L1 itself to be increased.

Seventh Preferred Embodiment

Figure 20A:
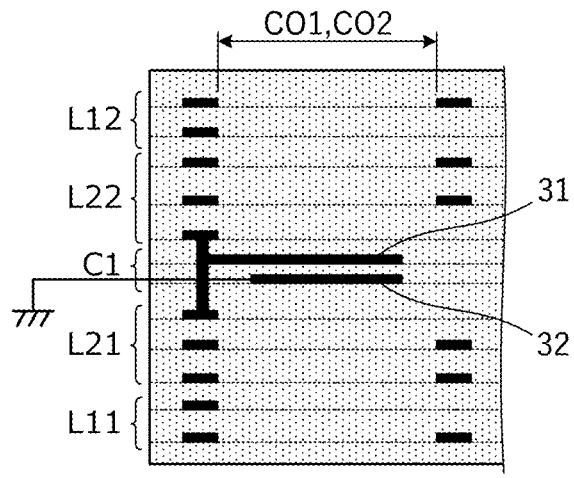
FIGS. 20A to 20C are diagrams illustrating the difference in the size between coil openings of inductors and capacitor conductive patterns 31 and 32.
Figure 20B:
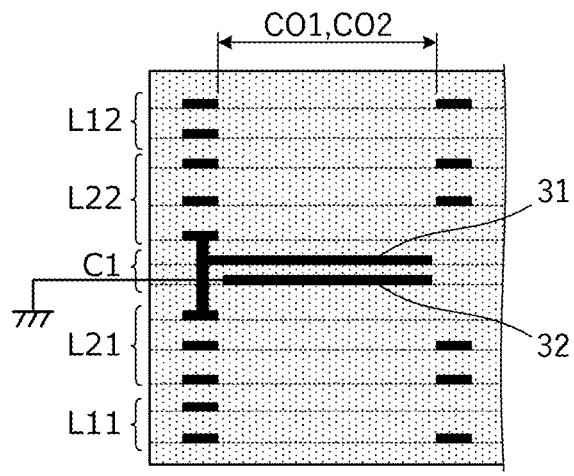
Figure 20C:
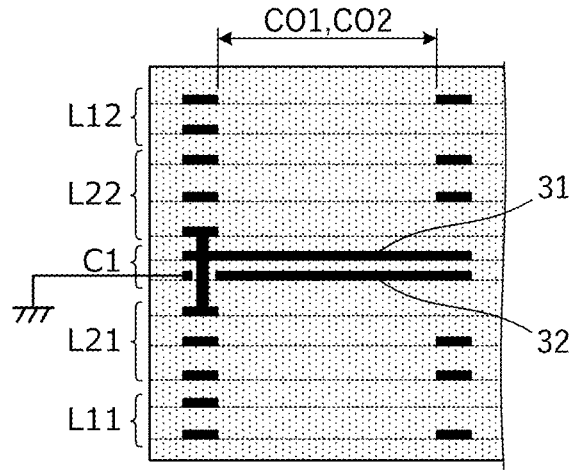

The relationship between the size of the capacitor conductive patterns and the size of coil openings is particularly described in a seventh preferred embodiment. FIGS. 20A to 20C are diagrams illustrating the difference in the size between the coil openings of the respective inductors and the capacitor conductive patterns 31 and 32.

FIG. 20A is the same example as the filter element 101 illustrated in FIG. 5. In this filter element, a portion of the coil openings CO1 and CO2 of the first series inductor L11, the second series inductor L12, the first shunt inductor L21, and the second shunt inductor L22 is covered with the capacitor conductive patterns 31 and 32. In a filter element illustrated in FIG. 20B, the entire or substantially the entire coil openings CO1 and CO2 are covered with the capacitor conductive patterns 31 and 32. In a filter element illustrated in FIG. 20C, the entire or substantially the entire first series inductor L11, the entire or substantially the entire second series inductor L12, the entire or substantially the entire first shunt inductor L21, and the entire or substantially the entire second shunt inductor L22 are covered with the capacitor conductive patterns 31 and 32.

As illustrated in FIG. 20A, the effect of reducing or preventing the coupling between the first shunt inductor L21 and the second shunt inductor L22 is achieved only by the coil openings CO1 and CO2 of the respective inductors partially covered with the capacitor conductive patterns 31 and 32. The same applies to the effect of reducing or preventing the coupling between the first series inductor L11 and the second series inductor L12.

In order to reduce or prevent unnecessary coupling between the inductors, the entire or substantially the entire coil openings CO1 and CO2 is preferably covered with the capacitor conductive patterns 31 and 32, as illustrated in FIG. 20B. In addition, the entire or substantially the entire inductors are more preferably covered with the capacitor conductive patterns 31 and 32, as illustrated in FIG. 20C.

Eighth Preferred Embodiment

Figure 21A:
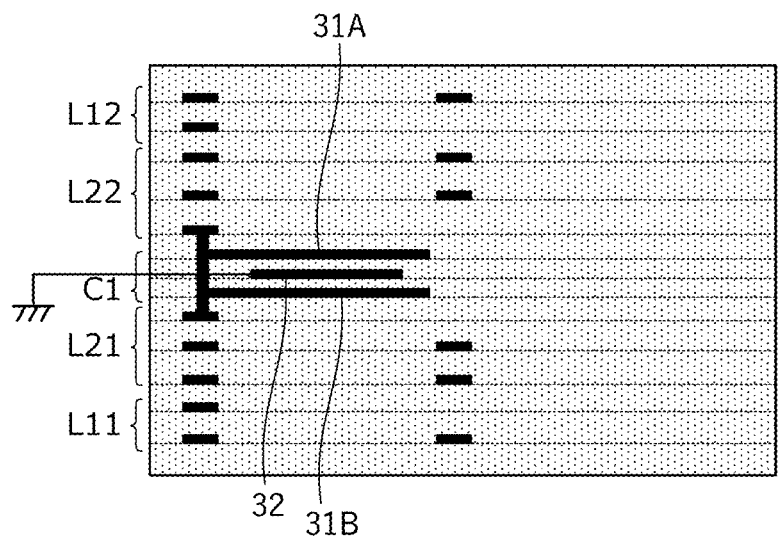
FIGS. 21A and 21B are diagrams illustrating the configuration of capacitor conductive patterns.
Figure 21B:
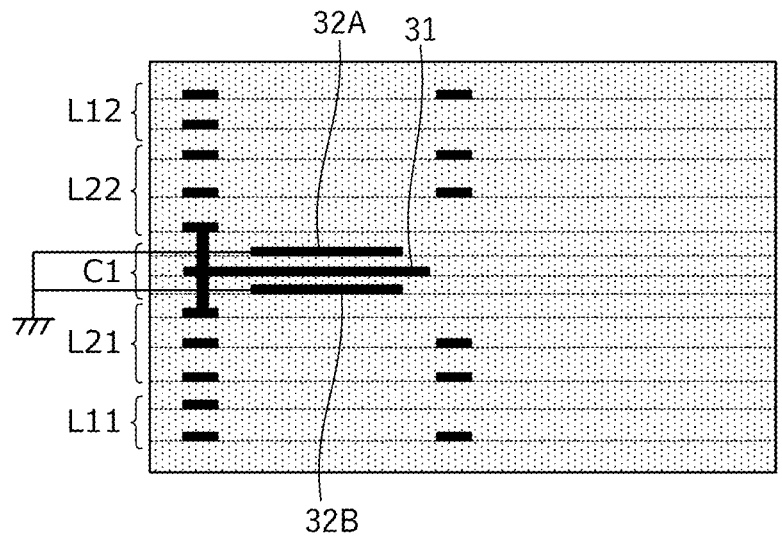
Figure 22A:
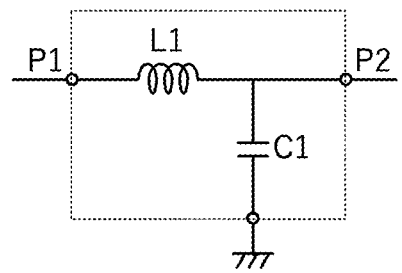
FIG. 22A is a circuit diagram of a low pass filter including an inductor L1 connected in series to a signal path and a capacitor C1 shunt-connected between the signal path and ground and FIG. 22B is a circuit diagram of a circuit in which the inductor L1 in the low pass filter illustrated in FIG. 22A is a portion of an auto transformer.
Figure 22B:
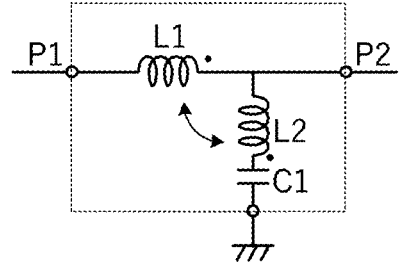

Filter elements are particularly described according to an eighth preferred embodiment of the present invention, in which the capacitor is defined by the capacitor conductive patterns of three or more layers. FIGS. 21A and 21B are diagrams illustrating the configurations of the capacitor conductive patterns.

In an example illustrated in FIG. 21A, the capacitor conductive pattern 32 is sandwiched between capacitor conductive patterns 31A and 31B. The capacitor conductive patterns 31A and 31B are connected with the interlayer connection conductors interposed therebetween and are connected to the first shunt inductor L21 and the second shunt inductor L22 via the interlayer connection conductors. The capacitor conductive pattern 32 is grounded.

In an example illustrated in FIG. 21B, the capacitor conductive pattern 31 is sandwiched between capacitor conductive patterns 32A and 32B. The capacitor conductive pattern 31 is connected to the first shunt inductor L21 and the second shunt inductor L22 with the interlayer connection conductors interposed therebetween. The capacitor conductive patterns 32A and 32B are grounded.

As in the structures illustrated in FIGS. 21A and 21B, the capacitor conductive patterns of three or more layers may be alternately arranged to define the capacitor.

As described in the present preferred embodiment, the capacitor C1 may be defined by the capacitor conductive patterns of three or more layers. With this structure, a desired capacitance is capable of being produced using a limited small plane area. In addition, the equivalent series inductance ESL is effectively reduced.

The preferred embodiments described above are only examples and the preferred embodiments are not limited to those described above. Modifications or changes of the preferred embodiments are appropriately available for the person of ordinary skill in the art. The scope of the present invention is not indicated by limited by the preferred embodiments described above but the scope of the appended claims. In addition, changes from the preferred embodiments within the scope equivalent to the scope of the claims is included in the scope of the present invention.

For example, in the cross-sectional views of the filter elements described in the above preferred embodiments, although the inductors and the capacitors are provided at one of the multiple insulating layers, the conductive patterns of the inductors may be provided along the outer periphery of the insulating layers.

In the preferred embodiments described above, the size of the first opening CO1 surrounded by the conductive patterns defining the first series inductor L11 and the second series inductor L12 is the same or substantially the same as that of the second opening CO2 surrounded by the conductive patterns defining the first shunt inductor L21 and the second shunt inductor L22 and the entire or substantially the entire first opening CO1 is overlapped with the entire or substantially the entire second opening CO2 viewed from the lamination direction of the insulating layers. However, the size of the opening CO1 may be different from the size of the opening CO2 and the first opening CO1 may be partially overlapped with the second opening CO2.

Although the winding axes of all the first series inductor L11, the first shunt inductor L21, the second shunt inductor L22, and the second series inductor L12 are in a coaxial relationship in the preferred embodiments described above, the winding axes may be different from each other.

In addition, the elements in the preferred embodiments may be manufactured, for example, through a photolithography process described below. First, photosensitive conductive paste is applied on insulating base materials formed by applying insulating paste through screen printing, and coil conductive patterns or capacitor conductive patterns and terminal conductive patterns are formed on the respective insulating base materials through the photolithography process. Next, photosensitive insulating paste is subjected to the screen printing to form openings and via holes (the openings for forming via conductors). The photosensitive insulating paste also forms the insulating base materials. Then, the photosensitive conductive paste is subjected to the screen printing to form the coil conductive patterns or the capacitor conductive patterns and the terminal conductive patterns through the photolithography process. This forms the terminal conductive patterns in the openings, forms the via conductors in the via holes, and forms the coil conductive patterns or the capacitor conductive patterns on the insulating paste. Since the respective terminals of the elements are composed of the multiple laminated terminal conductive patterns by repeating the above process, all the insulating base materials are provided with the terminal conductive patterns.

The method of forming the conductive patterns is not limited to the method described above. For example, the conductive patterns may be formed through printing with conductor paste using a screen printing plate having the openings of conductive pattern shapes. In addition, the method of forming outer electrodes is not limited to the above one. For example, terminal electrodes may be formed through dipping or sputtering of the conductor paste on a laminated body and a plating process may be performed to the surfaces of the terminal electrodes.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter element comprising:
a first input-output terminal, a second input-output terminal, a ground terminal, a series inductor connected in series between the first input-output terminal and the second input-output terminal, a shunt inductor shunt-connected between a point between the first input-output terminal and the second input-output terminal and the ground terminal, and a capacitor connected in series to the shunt inductor; and
a multilayer body including a plurality of insulating layers, a plurality of conductive patterns provided along the plurality of insulating layers, and a plurality of interlayer connection conductors provided in the plurality of insulating layers; wherein
the capacitor includes a capacitance between conductive patterns of the plurality of conductive patterns provided on different layers of the plurality of insulating layers;
the series inductor includes conductive patterns of the plurality of conductive patterns on one or more layers of the plurality of insulating layers, is wound around an axis along a lamination direction of the plurality of insulating layers, and includes a first opening surrounded by the conductive patterns of the series inductor viewed from the lamination direction;
the shunt inductor includes conductive patterns of the plurality of conductive patterns on one or more layers of the plurality of insulating layers, is wound around an axis along the lamination direction, and includes a second opening surrounded by the conductive patterns of the shunt inductor viewed from the lamination direction;
the shunt inductor includes a first shunt inductor and a second shunt inductor that are connected in parallel to each other;
at least one of the conductive patterns of the capacitor is overlapped with the first opening and the second opening viewed from the lamination direction;
the capacitor is sandwiched between the first shunt inductor and the second shunt inductor in the lamination direction;
the series inductor is magnetically coupled to the first shunt inductor; and
the first shunt inductor is sandwiched between the capacitor and the series inductor in the lamination direction.

2. The filter element according to claim 1, wherein
the plurality of conductive patterns includes a conductive pattern that defines a portion of the capacitor and is grounded and a conductive pattern that defines a portion of the capacitor and is not grounded;
among the conductive patterns of the first shunt inductor, the conductive pattern closest to the capacitor is electrically connected to the conductive pattern that is not grounded, among the conductive patterns of the capacitor; and
among the conductive patterns of the second shunt inductor, the conductive pattern closest to the capacitor is electrically connected to the conductive pattern that is not grounded, among the conductive patterns of the capacitor.

3. The filter element according to claim 2, wherein
one surface in the lamination direction of the multilayer body is a mounting surface;
the mounting surface is a surface with which the filter element is mounted on an external circuit element; and
the conductive pattern that is grounded, among the conductive patterns of the capacitor, is closest to the mounting surface.

4. The filter element according to claim 1, wherein
the series inductor includes a first series inductor and a second series inductor that are connected in parallel to each other;
the capacitor is sandwiched between the first series inductor and the second series inductor in the lamination direction;
the first series inductor is magnetically coupled to the first shunt inductor; and
the second series inductor is magnetically coupled to the second shunt inductor.

5. The filter element according to claim 1, wherein
the series inductor includes a first series inductor and a second series inductor that are connected in parallel to each other;
the capacitor is sandwiched between the first series inductor and the second series inductor in the lamination direction;
the first series inductor is magnetically coupled to the first shunt inductor; and
the second series inductor is magnetically coupled to the second shunt inductor.

6. The filter element according to claim 1, wherein the conductive patterns of the capacitor include conductive patterns on two or more planes that are opposed to each other in the lamination direction.

7. The filter element according to claim 6, wherein an entirety or substantially an entirety of the conductive patterns of the series inductor and an entirety or substantially entirety of the conductive patterns of the shunt inductor are covered with at least one of the conductive patterns of the capacitor viewed from the lamination direction.

8. The filter element according to claim 6, wherein an entirety or substantially an entirety of the first opening and an entirety or substantially an entirety of the second opening are covered with at least one of the conductive patterns of the capacitor viewed from the lamination direction.

9. The filter element according to claim 1, wherein the conductive patterns of the capacitor include the conductive patterns of the series inductor and the shunt inductor and the conductive pattern of capacitance between the conductive patterns of the series inductor and the shunt inductor.

10. The filter element according to claim 9, wherein an entirety or substantially an entirety of the first opening and an entirety or substantially an entirety of the second opening are covered with at least one of the conductive patterns of the capacitor viewed from the lamination direction.

11. The filter element according to claim 9, wherein an entirety or substantially an entirety of the conductive patterns of the series inductor and an entirety or substantially entirety of the conductive patterns of the shunt inductor are covered with at least one of the conductive patterns of the capacitor viewed from the lamination direction.

12. The filter element according to claim 1, wherein the interlayer connection conductor with which the conductive patterns of the shunt inductor are connected to the conductive patterns of the capacitor, among the plurality of interlayer connection conductors, is positioned in an outer portion of the first opening and the second opening.

13. A filter element comprising:
a first input-output terminal, a second input-output terminal, a ground terminal, a series inductor connected in series between the first input-output terminal and the second input-output terminal, a shunt inductor shunt-connected between a point between the first input-output terminal and the second input-output terminal and the ground terminal, and a capacitor connected in series to the shunt inductor; and
a multilayer body including a plurality of insulating layers, a plurality of conductive patterns provided along the plurality of insulating layers, and a plurality of interlayer connection conductors provided in the plurality of insulating layers; wherein
the capacitor includes a capacitance occurring between conductive patterns of the plurality of conductive patterns provided on different layers of the plurality of insulating layers;
the series inductor includes conductive patterns of the plurality of conductive patterns on one or more layers of the plurality of insulating layers, is wound in a lamination direction of the plurality of insulating layers, and includes a first opening surrounded by the conductive patterns of the series inductor viewed from the lamination direction;
the shunt inductor includes conductive patterns of the plurality of conductive patterns on one or more layers of the plurality of insulating layers, is wound in the lamination direction, and includes a second opening surrounded by the conductive patterns of the shunt inductor viewed from the lamination direction;
the series inductor includes a first series inductor and a second series inductor that are connected in parallel to each other;
at least one of the conductive patterns of the capacitor is overlapped with the first opening and the second opening viewed from the lamination direction;
the capacitor is sandwiched between the first series inductor and the second series inductor in the lamination direction;
the shunt inductor is magnetically coupled to the first series inductor; and
the first series inductor is sandwiched between the capacitor and the shunt inductor in the lamination direction.

14. The filter element according to claim 13, wherein the interlayer connection conductor with which the conductive patterns of the shunt inductor are connected to the conductive patterns of the capacitor, among the plurality of interlayer connection conductors, is positioned in an outer portion of the first opening and the second opening.

15. The filter element according to claim 13, wherein the conductive patterns of the capacitor include conductive patterns on two or more planes that are opposed to each other in the lamination direction.

16. The filter element according to claim 15, wherein an entirety or substantially an entirety of the conductive patterns of the series inductor and an entirety or substantially entirety of the conductive patterns of the shunt inductor are covered with at least one of the conductive patterns of the capacitor viewed from the lamination direction.

17. The filter element according to claim 15, wherein an entirety or substantially an entirety of the first opening and an entirety or substantially an entirety of the second opening are covered with at least one of the conductive patterns of the capacitor viewed from the lamination direction.

18. The filter element according to claim 13, wherein the conductive patterns of the capacitor include the conductive patterns of the series inductor and the shunt inductor and the conductive pattern of capacitance between the conductive patterns of the series inductor and the shunt inductor.

19. The filter element according to claim 18, wherein an entirety or substantially an entirety of the first opening and an entirety or substantially an entirety of the second opening are covered with at least one of the conductive patterns of the capacitor viewed from the lamination direction.

20. The filter element according to claim 18, wherein an entirety or substantially an entirety of the conductive patterns of the series inductor and an entirety or substantially entirety of the conductive patterns of the shunt inductor are covered with at least one of the conductive patterns of the capacitor viewed from the lamination direction.

21. The filter element according to claim 13, wherein
the plurality of conductive patterns include a conductive pattern that defines a portion of the capacitor and is grounded and a conductive pattern that defines a portion of the capacitor and is not grounded;

among the conductive patterns of the first series inductor, the conductive pattern closest to the capacitor is electrically connected to the conductive pattern that is not grounded, among the conductive patterns of the capacitor; and among the conductive patterns of the second series inductor, the conductive pattern closest to the capacitor is electrically connected to the conductive pattern that is not grounded, among the conductive patterns of the capacitor.

22. The filter element according to claim 21, wherein one surface in the lamination direction of the multilayer body is a mounting surface;

the mounting surface is a surface with which the filter element is mounted on an external circuit element; and the conductive pattern that is grounded, among the conductive patterns of the capacitor, is closest to the mounting surface.

* * * * *